(12) United States Patent
Ware et al.

(10) Patent No.: US 11,323,118 B1
(45) Date of Patent: *May 3, 2022

(54) LOW POWER LOGIC CIRCUITRY

(71) Applicant: Rambus Inc., San Jose, CA (US)

(72) Inventors: Frederick A. Ware, Los Altos Hills, CA (US); John Eric Linstadt, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/007,232

(22) Filed: Aug. 31, 2020

Related U.S. Application Data

(63) Continuation of application No. 16/576,620, filed on Sep. 19, 2019, now Pat. No. 10,784,868, which is a continuation of application No. 16/148,977, filed on Oct. 1, 2018, now Pat. No. 10,447,270.

(60) Provisional application No. 62/596,754, filed on Dec. 8, 2017.

(51) Int. Cl.
  *H03K 19/0944* (2006.01)
  *H03K 19/20* (2006.01)

(52) U.S. Cl.
  CPC ......... *H03K 19/0944* (2013.01); *H03K 19/20* (2013.01)

(58) Field of Classification Search
  None
  See application file for complete search history.

(56) References Cited

U.S. PATENT DOCUMENTS

| | | | |
|---|---|---|---|
| 5,036,226 A | 7/1991 | Tonnu et al. | |
| 5,045,723 A | 9/1991 | Mao | |
| 5,128,563 A | 7/1992 | Hush et al. | |
| 5,148,061 A | 9/1992 | Hsueh et al. | |
| 5,151,622 A | 9/1992 | Thrower et al. | |
| 5,187,388 A | 2/1993 | Moy | |
| 5,227,679 A | 7/1993 | Woo | |
| 5,332,936 A | 7/1994 | Nakao | |
| 5,424,656 A | 6/1995 | Gibson et al. | |
| 5,838,169 A | 11/1998 | Schom | |
| 6,104,213 A | 8/2000 | Dhong et al. | |
| 6,147,925 A | 11/2000 | Tomishima et al. | |
| 6,559,685 B2 | 5/2003 | Green | |
| 7,477,073 B1 * | 1/2009 | Tuan | H03K 19/17736 326/101 |
| 7,852,121 B2 | 12/2010 | Rhee et al. | |

(Continued)

OTHER PUBLICATIONS

Ram K. Krishnamurthy et al., "Exploring the Design Space of Mixed Swing QuadRail for Low-Power Digital Circuits", IEEE Transactions On Very Large Scale Integration (VLSI) Systems, Dec. 1997, pp. 388-400, vol. 5, No. 4.

*Primary Examiner* — Seokjin Kim
(74) *Attorney, Agent, or Firm* — Charles Shemwell

(57) ABSTRACT

A combinational logic circuit includes input circuitry to receive a first input signal that transitions between upper and lower voltages of a first voltage domain, and to generate, in response to the transitions of the first input signal, a first localized signal that transitions between upper and lower voltages of a second voltage domain. The combinational logic circuit additionally includes output circuitry to generate a first output signal that transitions between the upper and lower supply voltages of the first voltage domain based at least in part on the transitions of the first localized signal.

20 Claims, 5 Drawing Sheets

(56) References Cited

U.S. PATENT DOCUMENTS

| | | |
|---|---|---|
| 9,093,987 B1 | 7/2015 | Gorman |
| 10,447,270 B2 | 10/2019 | Ware et al. |
| 2012/0056656 A1 | 3/2012 | Chen |
| 2019/0097633 A1* | 3/2019 | Ullmann ............ H03K 19/0175 |

* cited by examiner

FIG. 2 Dual-Voltage-Domain Pass-Gate Logic Implementation

FIG. 4 Energy/op and Circuit Delay vs $V_{DD}$ - Comparison

Level Converter
($V_{01} \rightarrow V_{03}$)

Non-Shifting
Small-Swing Buffer
(SE to DE)

Non-Shifting
Small-Swing Buffer
(DE to DE)

US 11,323,118 B1

LOW POWER LOGIC CIRCUITRY

CROSS REFERENCE TO RELATED APPLICATIONS

This application is a continuation of U.S. application Ser. No. 16/576,620 filed Sep. 19, 2019 (now U.S. Pat. No. 10,784,868), which is a continuation of U.S. application Ser. No. 16/148,977 filed Oct. 1, 2018 (now U.S. Pat. No. 10,447,270), which claims the benefit of U.S. provisional application No. 62/596,754 filed Dec. 8, 2017. Each of the foregoing patent applications is hereby incorporated by reference.

TECHNICAL FIELD

The present disclosure relates generally to data processing and more particularly to low power logic circuitry implemented in integrated circuit devices.

DRAWINGS

The various embodiments disclosed herein are illustrated by way of example, and not by way of limitation, in the figures of the accompanying drawings and in which like reference numerals refer to similar elements and in which.

Figure 2:
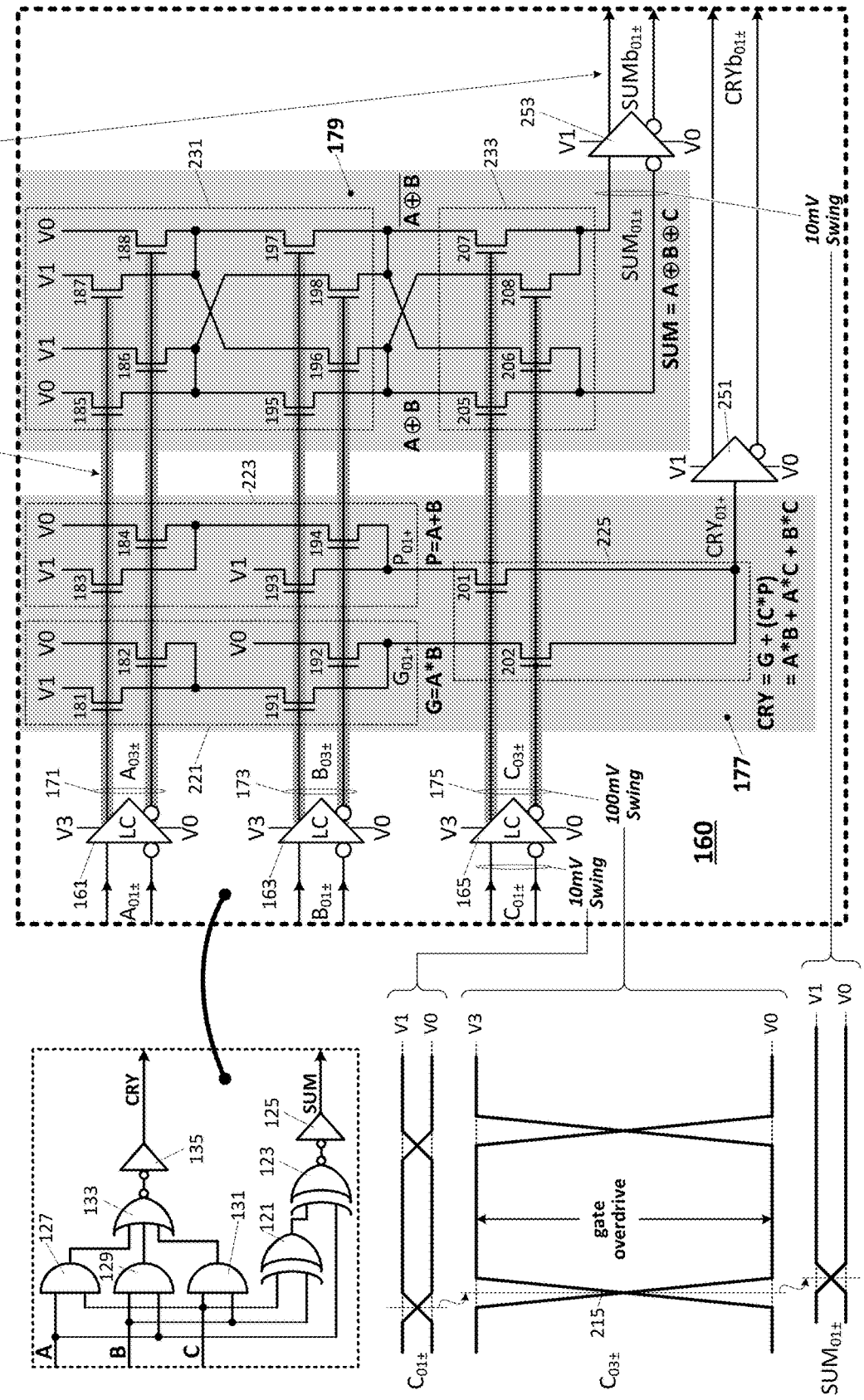
FIG. 2 illustrates a dual-domain pass-gate logic implementation of the carry logic and summation logic depicted symbolically in FIG. 1, showing both carry and summation signal generation in a single logic cell.
Figure 3:
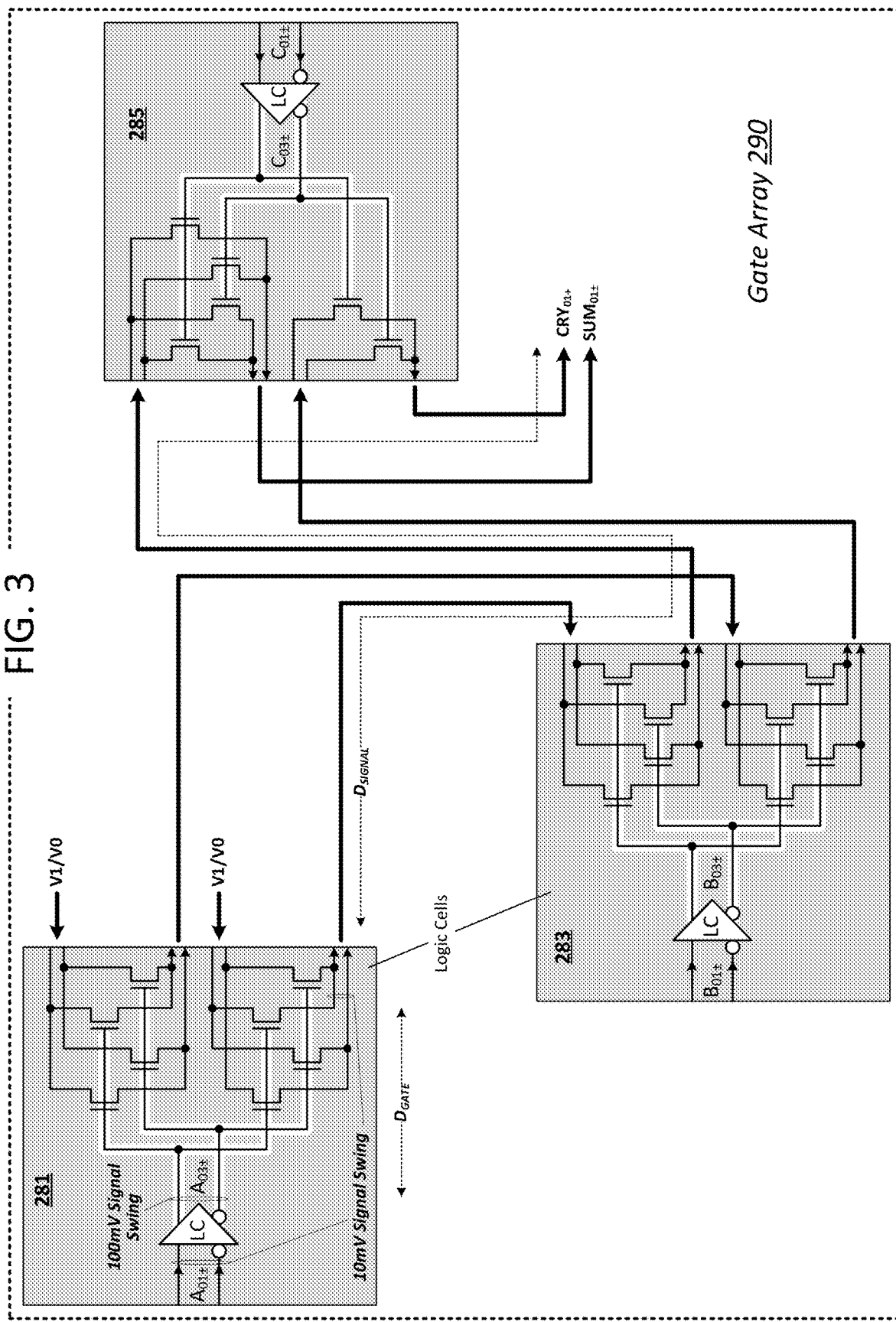
FIG. 3 illustrates an alternative ripple-adder slice with component pass-gate logic elements disposed (distributed) within respective logic cells of a gate array.
Figure 4:
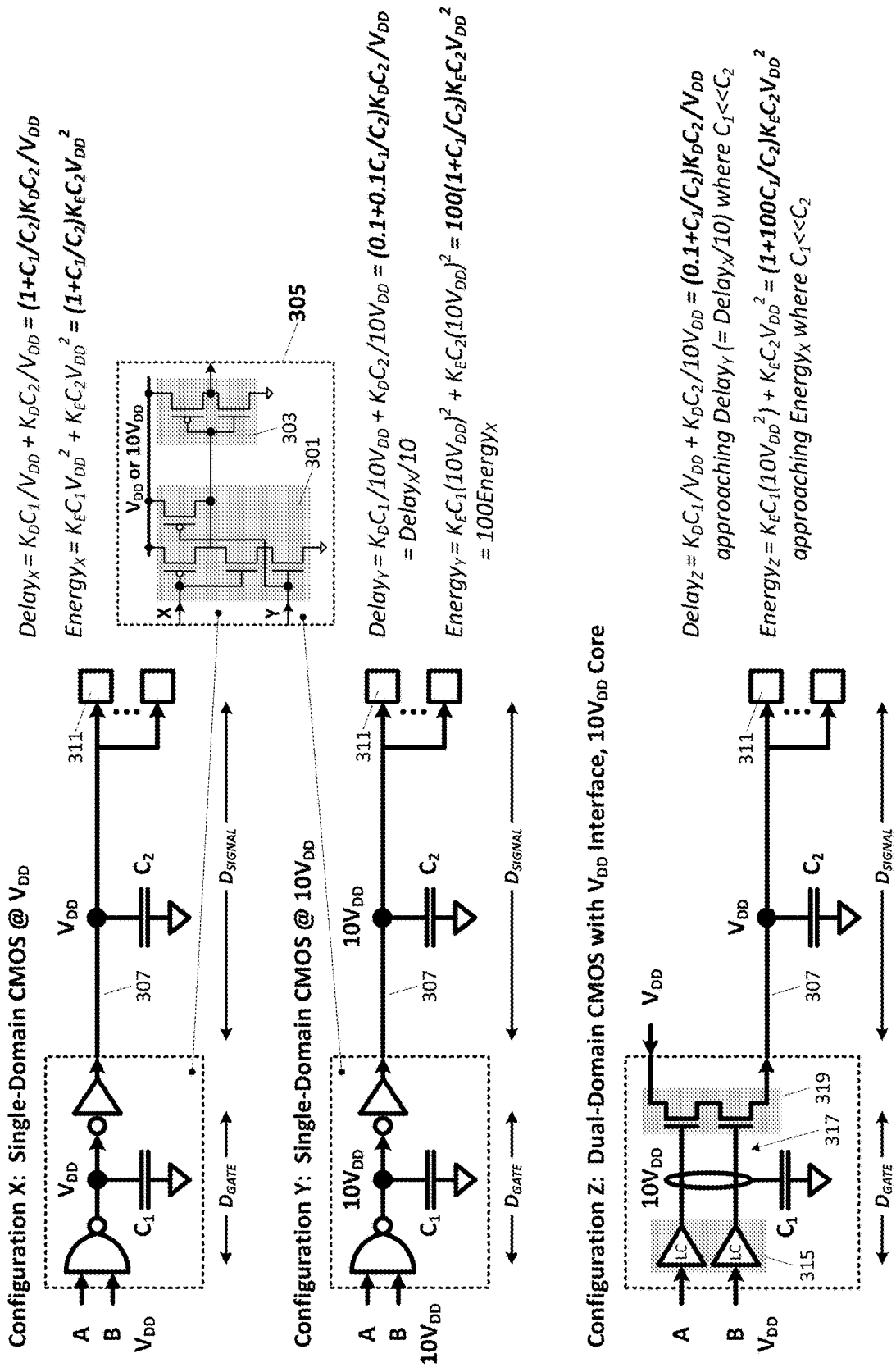
Figure 5:
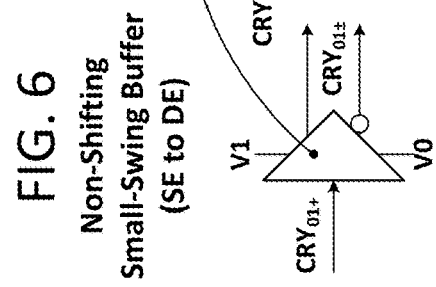
Figure 6:
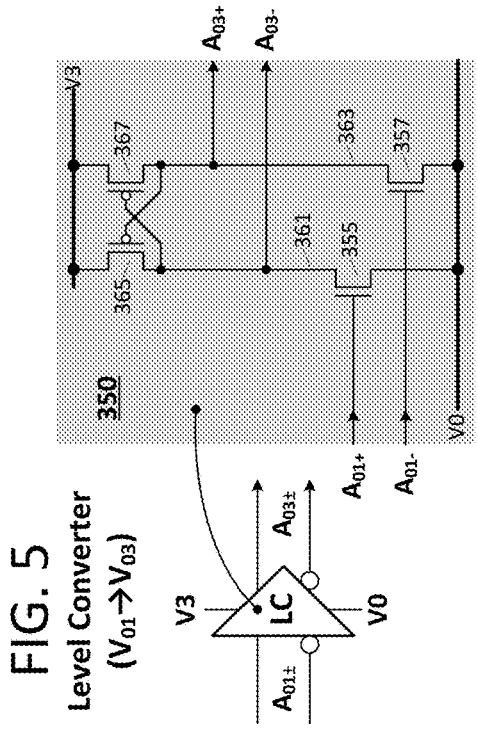
Figure 7:
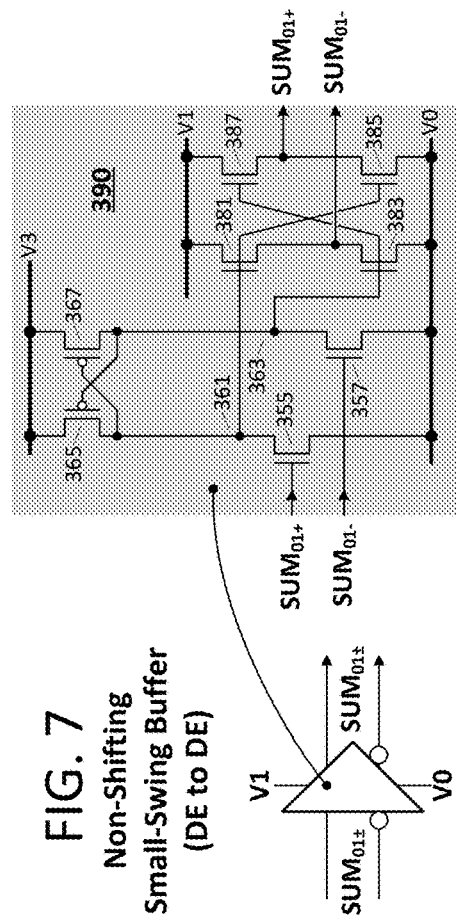

FIG. 4 contrasts energy-per-operation and circuit propagation delay for three CMOS supply voltage configurations—two single-domain supply voltage configurations and a dual-domain configuration;

FIG. 5 illustrates an embodiment of a single-stage static level converter that may implement the level converters shown in FIGS. 2, 3 and 4; and FIGS. 6 and 7 illustrate respective non-shifting small-swing line drivers and that yield a high-current small-swing output signal in the same voltage domain as the input signal.

DETAILED DESCRIPTION

Dual voltage domain logic circuits having small-swing input/output interfaces and large-swing internal control nodes are disclosed in various embodiments herein. In a number of implementations, relatively large-swing voltages are developed at low-capacitance control nodes localized within respective logic cells to yield increased small-swing output drive current over higher-capacitance/long-haul signal paths that extend between logic cells, improving energy efficiency relative to single large-swing voltage domain implementations (i.e., as large swing signals in dual-domain implementations are limited to low-capacitance nodes) without the signaling speed penalty incurred in a single small-swing voltage domain implementation. While applicable in a variety of environments, the enhanced energy efficiency achieved through the dual-domain (dual voltage domain) approaches herein is particularly beneficial in voltage-scaled cryogenic applications (i.e., temperature domain generally below ~93 Kelvin (K), and more specifically at or around the ~77K boiling point of liquid nitrogen or the ~4K boiling point of liquid helium) where operational power dissipated as heat is generally dwarfed by compensatory cooling power.

Figure 1:
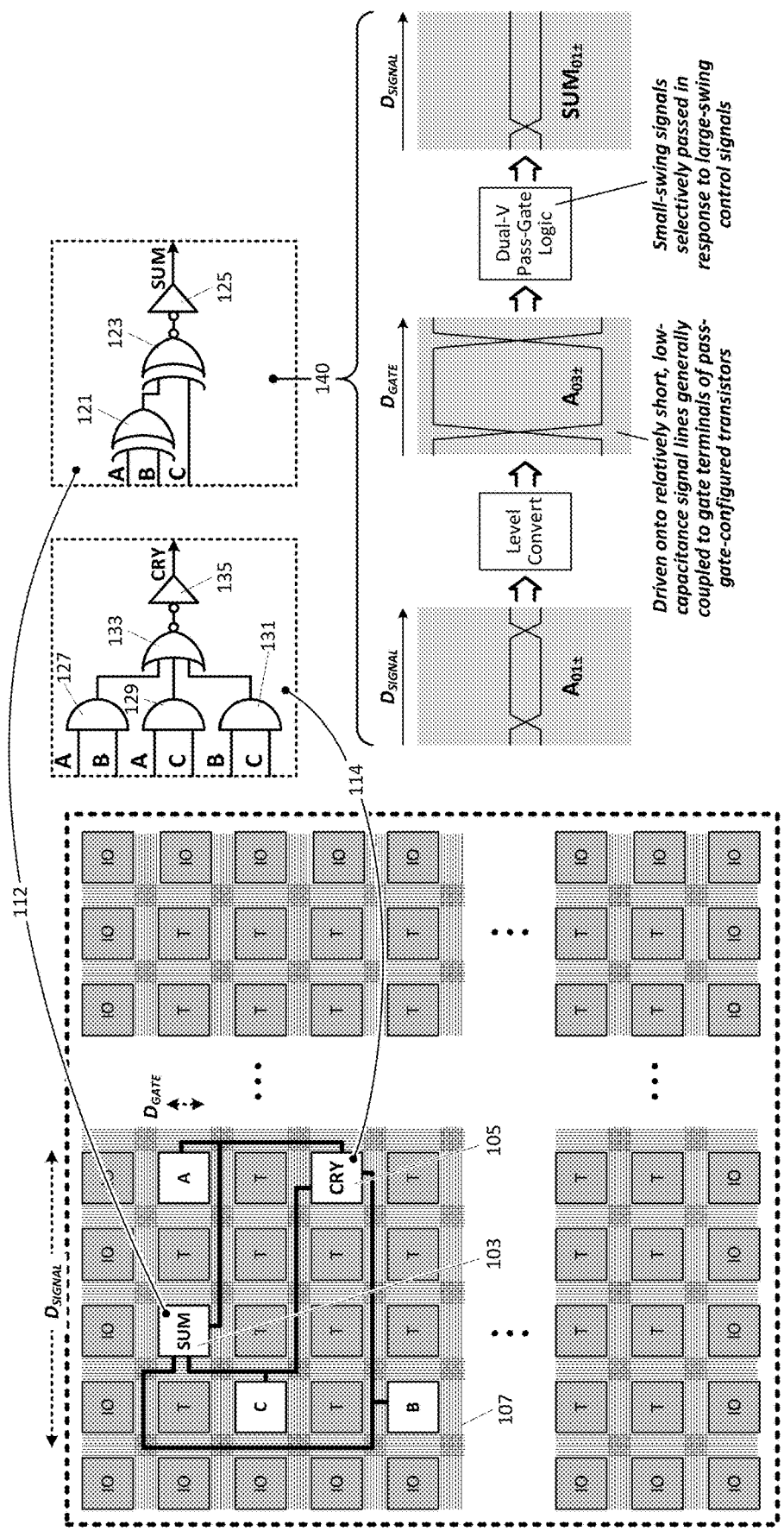
FIG. 1 illustrates a dual-domain logic implementation in the form of a three-bit ripple-adder slice having component logic elements distributed within respective cells of a programmable/configurable gate array.

FIG. 1 illustrates a dual-domain logic implementation in the form of a three-bit ripple-adder slice having component logic elements distributed within respective cells of a programmable/configurable gate array 100 (or application-specific integrated circuit (ASIC), programmable logic device, etc.). The three-bit adder slice is carried forward in a number of examples below, though the dual-domain operating principles and circuit implementations may be applied in virtually any combinational logic circuits or components thereof.

Still referring to FIG. 1, individual cells within gate array 100 are constituted by a predetermined number of transistors, generally interconnected by one or more customized (or preconfigured) metallization layers. Specialized input/output cells ("I/O") at the edge of the gate array implement signal drivers and receivers to facilitate chip-to-chip communication, while interior "logic" cells ("T") contain metal oxide semiconductor transistors (MOS transistors, including complementary MOS or CMOS transistors in some cases) that can be selectively configured to perform generalized combinational functions—in this case a three-bit summation logic function (SUM) within logic cell 103 and three-bit carry logic function (CRY) within logic cell 105. As shown, metalized interconnects 107 conduct signals over relatively long-haul cell-to-cell distances, "$D_{SIGNAL}$," (e.g., carrying signals A, B and C, generated within respective logic cells so designated, to input nodes of the sum and carry logic cells. 103, 105), while intra-cell interconnects (metal, conductive polysilicon, etc.) implement much shorter-distance ($D_{GATE}$) and lower-capacitance conduction paths between transistors clustered/localized within a given cell.

Symbolic views 112 and 114 of summation cell 103 and carry cell 105 illustrate (abstractly, in the form of symbolic logic operators) exemplary logical operations attendant to summation and carry signal generation within a three-bit ripple adder slice. As shown at 112, summation cell 103 performs an XOR operation with respect to addend bits A and B (indicated by symbol 121), an XNOR operation 123 with respect to addend bit C and the A, B XOR result, and an inversion operation 125 to produce Sum=A XOR B XOR C. Carry cell 105 performs respective AND operations with respect to addend bits A and B (127), A and C (129), and B and C (131), a NOR operation 133 with respect to the AND operation results, and an inversion operation 135 to produce Carry=A*B+A*C+B*C (where 'XOR' refers to exclusive-OR, XNOR refers to complement-exclusive-OR, '*' denotes logic AND, and '+' denotes logic OR).

As illustrated at 140 with respect to symbolic view 112 of summation cell 103 (and also applicable to carry cell 105), signals input to and output from a given logic cell are conveyed as relatively small-swing (low voltage) signals. Small-swing input signals are level-converted to relatively large-swing signals on short-haul, low-capacitance signal conductors generally coupled to gate terminals of pass-gate-configured MOS transistors ("pass-configured transistors), with those transistors implementing Boolean logic functions (including those shown symbolically at 112 and 114) by selectively coupling small-swing voltage supply rails to logic cell output nodes in accordance with the large-swing control signals. In a number of embodiments, the large-swing signals applied to the gates of pass-configured MOS transistors yields a significant transistor overdrive (i.e., gate-to-source voltage, $V_{GS}$, much greater than the transistor threshold voltage, $V_T$) and thus relatively high drain-to-source current through those transistors to rapidly transition (i.e., charge and discharge) long-haul or otherwise higher-capacitance output signal lines between small-swing voltages.

FIG. 2 illustrates a dual-domain pass-gate logic implementation 160 of the carry logic and summation logic depicted symbolically in FIG. 1, showing both carry and summation signal generation in a single logic cell. In the depicted embodiment, each of the incoming addend bits (A, B, C) is conveyed in a respective small-swing addend signal, $A_{01\pm}$, $B_{01\pm}$, $C_{01\pm}$—in this case a 10 millivolt (mV) signal (i.e., established by supply voltage rails V1 and V0) approximately twice the ~5 mV threshold voltage ($V_T$) of MOS transistors in a 4K temperature domain (larger small-swing signals may apply in warmer temperature domains/larger MOS threshold voltages—e.g., threshold voltages below 10 mV, 20 mV, 25 mV, etc.). Each of the addend signals is level converted to a larger-swing signal by a respective level converter 161, 163, 165, with that large-swing counterpart transitioning between voltage rails V0 and V3, with V3>>V1. As a matter of terminology, signal lines are occasionally referred to herein by the names of the signals they conduct (distinguishing by context between signal line and conveyed signal) and the signal references themselves are subscripted to explicate the voltage domain to which the signal is constrained and the active signal level (low or high). In FIG. 2, for example, incoming addend signals $A_{01\pm}$, $B_{01\pm}$ and $C_{01\pm}$ are differential signals (indicated by '±', as opposed to '+' for an active-high signal or '−' for an active-low signal) constrained to a small-swing voltage domain (i.e., "small-swing domain" signal that swings between the V0 and V1 voltage rails and thus subscript "01"), while corresponding level-converter outputs, $A_{03\pm}$, $B_{03\pm}$ and $C_{03\pm}$ are a differential addend signals (that transition in response to transitions in the incoming small-swing added signals) that swing between V0 and V3 rails of a large-swing voltage domain (hence the "03" subscript).

Still referring to FIG. 2, the large-swing addend signals are driven onto respective local control nodes 171, 173 and 175, differential nodes in this example having true and complement components which extend for relatively short distances (and thus have relatively small parasitic capacitance) to gate terminals of transistors configured for pass-gate logic implementation of pass-gate carry logic 177 and pass-gate carry summation logic 179. More specifically, true and complement components of large-swing signal $A03\pm$ are supplied via node 171 to gates of transistors 181, 183, 185 and 187 (true component) and transistors 182, 184, 186 and 188 (complement component), with transistors 181, 182, 183 and 184 constituting part of pass-gate carry logic 177, and transistors 185, 186, 187 and 188 forming part of a pass-gate summation logic 179. True and complement components of large-swing signal $B03\pm$ are likewise applied via node 173 to gates of four transistors (191, 192, 193 and 194) within the pass-gate carry logic and to gates of four transistors (195, 196, 197, 198) within pass-gate summation logic, and true/complement components of large-swing signal $C03\pm$ are coupled via node 175 to gates of two transistors (201, 202) within the carry logic and gates of four transistors (205, 206, 207, 208) within the summation logic.

Within pass-gate carry logic 177, transistor pairs 181/182 and 191/192 respond to localized large-swing signals $A03\pm$ and $B03\pm$, respectively, by generating a small-swing signal G01+ indicative of a logic AND of the A and B addend bits within pass-gate AND circuit 221. That is, if addend bit A is a logic 1 (i.e., true component of $A03\pm$ at V3, complement component of $A03\pm$ at V0), transistor 181 will be switched on to pass V1 to the drain of transistor 191, while transistor 182 is switched off. Conversely, if addend bit is A is a logic '0', transistor 182 will be switched on to pass V0 to the drain of transistor 191 while transistor 181 is switched off. With respect to addend bit B, transistor 191 will be switched on by a logic '1' while transistor 192 is switched off, thereby passing the voltage at the drain of transistor 191 to the $G_{01+}$ output (at the drain of transistor 202) and thus yield a small-swing logic '1' at $G_{01+}$ if bits A and B are both high, and a logic '0' at $G_{01+}$ if A is low and B is high. If addend bit B is a low (logic '0' in this example), then transistor 191 will be switched off and transistor 192 switched on to produce a logic '0' (i.e., switched coupling to supply rail V0) at $G_{01+}$ regardless of the state of addend bit A. Thus, pass-gate AND circuit 221 yields G=A*B, where '*' denotes a logic AND.

Within pass-gate OR logic block 223, transistors 183 and 184 operate in the same manner as transistors 181 and 182 to drive the drain of transistor 194 to V1 or V0 according to the state of addend bit A ('1' or '0', respectively). If addend bit B is high, transistor 193 is switched on to pass (switchably couple) supply rail V1 to the $P_{01+}$ output (and thus to the drain of transistor 201) while transistor 194 is switched off. If addend bit B is low, transistor 194 is switched on (and transistor 193 switched off) to pass the V1 or V0 state of bit A (at the drain of transistor 194) to the $P_{01+}$ output—overall yielding a logic '1' at the $P_{01+}$ output if either or both of addend bits A and B are high (and a logic '0' if both bits are low) and thus a logic OR of bits A and B.

Addend bit C is applied via pass-gate logic block 225, passing the $P_{01+}$ state at the drain of transistor 201 to output node $CRY_{01+}$ (at the input of small-signal output driver 251) in response to a logic '1' C addend, and passing the $G_{01+}$ state at the drain of transistor 202 to the output node if the C addend bit is a '0'. The net result is $CRY_{01+}$= G+(C*P)=A*B+A*C+B*C, the desired carry-bit expression.

Referring to pass-gate summation logic 179 (FIG. 2), logic block 231 yields the exclusive-OR output of addend bits A and B at the common drains of transistors 205 and 208 (the "XOR" node) and the exclusive-NOR of those addend bits at the common drains of transistors 206 and 207 (the "XNOR" node). More specifically in the exclusive-OR assertion case (XOR=1, XNOR=0) where A is high and B is low, transistors 187 and 196 conduct V1 to the XOR node, while transistors 185 and 198 conduct V0 to the XNOR node. In the other exclusive-OR assertion case where B is high and A is low, transistors 186 and 195 conduct V1 to the XOR node, while transistors 188 and 197 conduct V0 to the XNOR node. In the exclusive-NOR assertion cases (exclusive-OR deasserted), when both A and B are high, transistors 187 and 197 conduct V1 to the XNOR node while transistors 185 and 195 conduct V0 to the XOR node; and when A and B are both low, transistors 186 and 198 conduct V1 to the XNOR node while transistors 188 and 196 conduct V0 to the XOR node.

Transistors 205, 206, 207 and 208 implement an exclusive-OR (233) of addend bit C with the A/B exclusive-OR result, passing the logic state of A XOR B to the true-component of the summation logic output ($SUM_{01\pm}$) via transistor 208 if C is low, and passing the complement logic state (A XNOR B) to the complement component of the summation logic output via transistor 206. If C is high, the reverse output is generated, with the A XNOR B result passed to the true summation output component via transistor 207 and the A XOR B result passed to the complement summation output via transistor 205. By this operation, if one and only one of addend bits A, B and C is a logic '1', or if all three of those bits are a logic '1' (four of the eight possibilities), then $SUM_{01\pm}$ will be driven to a small-swing logic '1' state at the differential input of signal driver 253 (i.e., true node driven high, complement node driven low) and likewise driven to a logic '1' state at the output of driver 253. Conversely, if any of the other four possible bit patterns exists (i.e., none of A, B, C is a '1', or a solitary one A, B and C is a '0'), $SUM_{01\pm}$ will be driven to a small-swing logic '0' state at the input of driver 253 and likewise driven to a logic '0' state at the driver output.

Non-shifting signal drivers 251 and 253 may be omitted in embodiments in which the supply rail V1 is sufficiently greater than the MOS threshold voltage (i.e., such that threshold voltage drops across multiple transistors do not unduly lower the output signal amplitude) and/or where the output line otherwise driven by those signal drivers is relatively unloaded. Where implemented, the signal drivers perform a buffering function and are thus referred to herein as signal buffers—receiving unbuffered input signals $CRY_{01+}$ and $SUM_{01\pm}$ and, in response, driving like-polarity "buffered" signals, $CRYb_{01\pm}$ and $SUMb_{01\pm}$ onto respective differential output paths.

Reflecting on the operation of exemplary pass-gate logic cell 160, input signals arriving via relatively high-capacitance long-haul signal paths and output signals driven onto long-haul signal paths are constrained to the small-swing voltage domain, thus avoiding the energy and delay penalties that would be incurred by larger swing signals. Within the cell core, however, level converters 161, 163, 165 first produce large-swing signals on short relatively low-capacitance nodes, strongly overdriving pass-configured transistors 181-188, 191-198, 201, 202 and 205-208 (e.g., by a factor of 20× in the case of 100 mV V3 supply and a 5 mV MOS threshold voltage at 4K) and thereby increasing the output drive current of the pass-gate-configured transistors to speed production of sum and carry signals at the logic cell output.

FIG. 3 illustrates an alternative ripple-adder slice with component pass-gate logic elements disposed in respective logic cells 281, 283, 285 of a gate array 290 (instead of consolidation in the single cell depicted in FIG. 2). As shown, small-swing signals from logic components in one cell are driven over long-haul paths to component pass-gate logic elements in another cell (e.g., from cell 281 to cell 283 to cell 285) to produce the carry and summation results shown in FIG. 2. Within each cell the strong gate overdrive produced by the input-signal level conversion (i.e., from the V0/V1 domain to the V0/V3 domain on gate-drive nodes coupled to gates of pass-configured transistors) produces relatively high-current small-swing signals on the cell-to-cell (inter-cell) signal lines, speeding signal state transitions and thus reducing overall latency between input signal arrival (bits A, B, C) and output signal generation (CRY, SUM).

FIG. 4 contrasts energy-per-operation and circuit propagation delay for three CMOS supply voltage configurations—single-domain supply voltages of $V_{DD}$ and $10V_{DD}$ in configurations 'X' and 'Y', respectively, and a dual-domain configuration 'Z' having $V_{DD}$-level input and output interfaces and a $10V_{DD}$ core. In the single-domain X and Y configurations, input signals drive conventional CMOS logic elements (e.g., implemented by NAND element 301 and inverter 303 as shown at 305) that, in turn, drive long-haul signal line 307 to one or more downstream gates 311. As in the gate array examples above, the internal interface between NAND 301 and inverter 303 is characterized by a short-haul (local) conduction path having relatively low capacitance, $C_1$, while the long-haul signal path 307 to downstream gates has a significantly higher capacitance, $C_2$. As shown by the delay and energy expressions for the X and Y configurations, the gate propagation delay is inversely proportional to the supply voltage level (i.e., delay for $V_{DD}$ configuration X is 10 times longer than the delay for $10V_{DD}$ configuration Y), while the energy per operation is proportional to the square of the supply voltage (i.e., energy/op for $10V_{DD}$ configuration Y is $10^2=100$ times greater than the energy/op for $V_{DD}$ configuration X). Dual-domain configuration Z (i.e., having level converters 315 to drive large-swing signals onto internal core nodes 317, and pass-gate logic 319 to pass small-swing output signals), by contrasts, approaches the high signaling rate (low delay) of $10V_{DD}$ configuration Y while retaining the low-energy/op benefit of $V_{DD}$ configuration X—particularly where $C_2 \gg C_1$, as in the case of a relatively long inter-cell signal path, $D_{SIGNAL}$ (or other high-capacitance node between logic gates) in relation to the short-distance/low-capacitance of $D_{GATE}$. Accordingly, the dual-domain logic approach discussed above in reference to FIGS. 1-3 may be applied generally to logic circuits that drive long-haul or otherwise relatively high-capacitance signal lines to yield a delay-energy product lower than possible with conventional single-domain logic gates.

FIG. 5 illustrates an embodiment of a single-stage static level converter that may implement the level converters shown in FIGS. 2, 3 and 4, converting a differential input signal that swings between V0 and V1 supply rails of a first voltage domain (small-swing) to a large-swing differential output signal that transitions between supply rails V0 and V3 of a second voltage domain. As shown, small-swing input signal $A_{01+}$—and its complement $(A_{01-})$—collectively forming small-swing differential input signal $A_{01\pm}$—are supplied to gates of drive-node pull-down transistors 355 and 357 so that, depending on the input signal state, one of transistors 355 and 357 will be switched on to couple the corresponding output-drive node 361 or 363 to V0, while the other of transistors 355 and 357 is switched off. Drive-node pull-up transistors 365 and 367 are coupled source-to-drain between upper-domain rail V3 and output-drive nodes 361 and 363, respectively, and have gate terminals cross-coupled to counterpart drain terminals. That is, the gate of transistor 365 is coupled to drain terminal of transistor 367 (and vice-versa) and thus to the counterpart output-drive node (gate of transistor 365 coupled to output drive node 363; gate of transistor 367 coupled to output drive node 361) so that whichever of output-drive nodes 361 and 363 is pulled down to V0 via transistors 355 and 357 will switch on the pull-up transistor 365 or 367) coupled to the other of the output-drive nodes, thereby pulling that node to V3. Conversely, whichever of output drive nodes 361 and 363 is pulled up to V3 (i.e., via respective pull-up transistor 365 or 367) will switch off the other of pull-up transistors 365 or 367 to avoid contention on the pulled-down output-drive node. Altogether, output-drive nodes 361 and 363 are driven to large-swing differential voltage levels (V0 and V3) to drive internal logic nodes with a large-swing representation $(A_{03\pm})$ of the incoming small-swing signal $(A_{01\pm})$.

Still referring to FIG. 5, more efficient static level conversion may be effected through multi-stage conversion—for example, converting from the V1/V0 voltage domain to an intermediate voltage domain (V2/V0) in a first stage implemented as shown (except with the upper rail supplied by V2 instead of V3) and then converting from intermediate domain V2/V0 to large-swing domain V3/V0 in a second stage also implemented generally as shown in FIG. 5 except with input signals swinging between rails V0 and V2 instead of V0 and V1. In a specific embodiment targeted for cryogenic application, for instance, a first conversion stage may transition a signal from a 10 mV input swing to a 60 mV output swing, and then a second conversion stage may transition the 60 mV output from the first stage to a 100 mV second-stage output. In yet other embodiments, additional level conversion stages may be implemented, each stepping the signal swing up by a predetermined potential to yield, at the final stage, a desired large-swing output.

FIGS. 6 and 7 illustrate non-shifting small-swing line drivers 370 and 390 that yield a high-current small-swing output signal in the same voltage domain as the input signal—i.e., no level-shift between voltage domains (i.e., as in output signal drivers 251 and 253 of FIG. 2). In the single-ended input/differential-output example shown in FIG. 6, an active-high input signal $CRY_{01+}$ is supplied to an inverter formed by transistors 371 and 373 to produce complement (active-low) input signal $CRY_{01-}$. Complementary signals $CRY_{01+}$ and $CRY_{01-}$ are supplied to the gates of pull-down transistors 355 and 357, respectively, while cross-coupled pull-up transistors 365 and 367 are provided to pull up whichever of output-drive nodes 361 and 363 is not pulled down by its respective pull-down transistor (355 and 357). A non-shifting driver output stage is implemented by NMOS transistor pairs 381/383 and 385/387 each coupled between lower-domain voltage rails, V0 and V1. By this arrangement, whichever of the output-drive nodes (361 or 363) is pulled-up to V3 will super-drive the gates of one output-stage transistor within each pair (381 or 383 in one pair and 385 or 387 in the other), thus producing a high-current small-swing differential output—$CRY_{01\pm}$ in this example, having true and complement components $CRY_{01+}$ and $CRY_{01-}$.

The differential-input/differential-output non-shifting driver embodiment shown in FIG. 7 operates generally as described above with respect to FIG. 6, except that inverter stage transistors 371 and 373 are omitted. Rather, differential input signal components ($SUM_{01+}$ and $SUM_{01-}$ in this example) are applied to gates of pull-down transistors 355 and 357 to selectively pull down one of output-drive nodes 361 and 363, while cross-coupled pull-up transistors 365 and 367 pull the counterpart one of those output-drive nodes up to V3, thus effecting a large-swing (V3/V0) differential on output-drive nodes 361 and 363. As in the FIG. 6 embodiment, output-drive nodes 361 and 363 are coupled to the gates of transistors 381, 383, 385 and 387, with the pulled-up one of output drive-nodes 361 and 363 switching on either transistors 381/385 or 383/387 (while the alternate output-drive node is pulled down to switch off the counterpart transistor pair) to yield a first small-swing differential output signal at the drains of transistors 383 and 385.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, temperatures, temperature ranges, supply voltages, threshold voltages, transistor types, numbers of bits, signal path widths, signaling or operating frequencies and the like can be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:
1. A combinational logic circuit comprising:
   supply voltage inputs to receive first, second and third supply voltages, the first and third supply voltages constituting respective upper and lower voltages of a first voltage domain, and the second and third supply voltages (i) constituting respective upper and lower voltages of a second voltage domain and (ii) differing more than the upper and lower voltages of the first voltage domain by a factor of at least five;

first input circuitry to generate, in response to transitions of a first input signal between the upper and lower voltages of the first voltage domain, a first localized signal that transitions between the upper and lower voltages of the second voltage domain; and first output circuitry to generate a first output signal that transitions between the upper and lower supply voltages of the first voltage domain based at least in part on the transitions of the first localized signal.

2. The combinational logic circuit of claim 1 further comprising:

second input circuitry to receive the first output signal and to generate, in response to the transitions of the first output signal, a second localized signal that transitions between the upper and lower voltages of the second voltage domain; and second output circuitry to generate a second output signal that transitions between the upper and lower supply voltages of the first voltage domain based at least in part on the transitions of the second localized signal.

3. The combinational logic circuit of claim 2 further comprising third input circuitry to receive a second input signal and to generate, in response to the transitions of the second input signal, a third localized signal that transitions between the upper and lower voltages of the second voltage domain, and wherein the second output circuitry to generate the second output signal comprises circuitry to generate the second output signal based on the second localized signal and based on the third localized signal.

4. The combinational logic circuit of claim 2 wherein the first input circuitry to generate the first localized signal comprises circuitry to generate the first localized signal on a first node having a first capacitance, and wherein the combinational logic circuit further comprises a first signal line coupled between the first output circuitry and the second input circuitry to conduct the first output signal therebetween, the first signal line having a second capacitance that is substantially higher than the first capacitance.

5. The combinational logic circuit of claim 2 wherein the first input circuitry and first output circuitry are disposed within a first logic cell of a gate array and wherein the second input circuitry and second output circuitry are disposed in a second logic cell of the gate array.

6. The combinational logic circuit of claim 1 wherein the first output circuitry comprises a first transistor having a gate terminal coupled to receive the first localized signal and coupled source-to-drain between the upper voltage of the first voltage domain and an output node on which the first output signal is generated.

7. The combinational logic circuit of claim 6 wherein the first localized signal comprises a differential signal having true and complement component signals, wherein the gate terminal of the first transistor is coupled to receive the true component signal, and wherein the first output circuitry further comprises a second transistor coupled-source-to-drain between the lower voltage of the first voltage domain and the output node and having a gate terminal coupled to receive the complement component signal.

8. The combinational logic circuit of claim 6 wherein the first transistor has a threshold voltage at intended operating temperature, and wherein the upper and lower voltages of the first voltage domain differ by a voltage at least twice the threshold voltage.

9. A combinational logic circuit comprising:
first input circuitry to:
receive a first input signal that transitions between upper and lower voltages of a first voltage domain; and
generate, in response to the transitions of the first input signal, a first localized signal that transitions between upper and lower voltages of a second voltage domain, the upper and lower voltages of the second voltage domain differing (i) by not more than one volt, and (ii) more than the upper and lower voltages of the first voltage domain by a factor of at least five; and first output circuitry to generate a first output signal that transitions between the upper and lower supply voltages of the first voltage domain based at least in part on the transitions of the first localized signal.

10. The combinational logic circuit of claim 9 further comprising:

second input circuitry to receive a second input signal that transitions between the upper and lower voltages of the first voltage domain and to generate, in response to the transitions of the second input signal, a second localized signal that transitions between upper and lower voltages of a second voltage domain; and wherein the first output circuitry to generate the first output signal that transitions between the upper and lower supply voltages of the first voltage domain comprises circuitry to generate the first output signal based at least in part on a logical combination of the first and second localized signals.

11. A method of operation within a combinational logic circuit, the method comprising:
receiving first, second and third supply voltages, the first and third supply voltages constituting respective upper and lower voltages of a first voltage domain, and the second and third supply voltages constituting respective upper and lower voltages of a second voltage domain and differing more than the upper and lower voltages of the first voltage domain by a factor of at least five;

receiving, via first input circuitry, a first input signal that transitions between the upper and lower voltages of the first voltage domain;

generating, in response to the transitions of the first input signal, a first localized signal that transitions between the upper and lower voltages of the second voltage domain; and generating a first output signal that transitions between the upper and lower supply voltages of the first voltage domain based at least in part on the transitions of the first localized signal.

12. The method of claim 11 further comprising:
receiving the first output signal via second input circuitry generating, in response to the transitions of the first output signal, a second localized signal that transitions between the upper and lower voltages of the second voltage domain; and generating a second output signal that transitions between the upper and lower supply voltages of the first voltage domain based at least in part on the transitions of the second localized signal.

13. The method of claim 12 further comprising receiving a second input signal via third input circuitry and generating, in response to the transitions of the second input signal, a third localized signal that transitions between the upper and lower voltages of the second voltage domain, and wherein generating the second output signal comprises generating the second output signal based on the second localized signal and based on the third localized signal.

14. The method of claim 12 wherein generating the first localized signal comprises generating the first localized signal on a first node having a first capacitance, and wherein generating the first output signal comprises generating the first output signal on a first signal line that extends to the second input circuitry and has a capacitance substantially higher than the first capacitance.

15. The method of claim 11 wherein generating the first output signal based at least in part on the transitions of the first localized signal comprises (i) switchably coupling the upper voltage of the first voltage domain to an output node in response to a transition of the first localized signal to a voltage corresponding to the upper voltage of the second voltage domain, and (ii) switchably decoupling the upper voltage of the first voltage domain from the output node in response to a transition of the first localized signal to a voltage corresponding to the lower voltage of the second voltage domain.

16. The method of claim 15 wherein generating the first output signal based at least in part on the transitions of the first localized signal further comprises (i) switchably coupling the lower voltage of the first voltage domain to the output node when the first localized signal transitions to the voltage corresponding to the lower voltage of the second voltage domain, and (ii) switchably decoupling the lower voltage of the first voltage domain from the output node when the first localized signal transitions to the voltage corresponding to the upper voltage of the second voltage domain.

17. The method of claim 15 wherein switchably coupling the upper voltage of the first voltage domain to the output node comprises switching a first transistor to a conducting state, the first transistor having a threshold voltage not more than half the voltage difference between the upper and lower voltages of the first voltage domain.

18. The method of claim 11 wherein the upper and lower voltages of the first voltage domain differ more than the upper and lower voltage of the second voltage domain more than a factor of live.

19. The method of claim 11 wherein the upper and lower voltages of the second voltage domain differ by not more than one volt.

20. The method of claim 11 wherein generating the first localized signal that transitions between upper and lower voltages of the second voltage domain comprises generating the first localized signal within a cryogenic environment.

* * * * *